United States Patent
Yegnashankaran et al.

(10) Patent No.: US 7,863,644 B1
(45) Date of Patent: Jan. 4, 2011

(54) BIPOLAR TRANSISTOR AND METHOD OF FORMING THE BIPOLAR TRANSISTOR WITH A BACKSIDE CONTACT

(75) Inventors: Visvamohan Yegnashankaran, Cupertino, CA (US); Hengyang Lin, San Ramon, CA (US)

(73) Assignee: National Semiconductor Corporation, Santa Clara, CA (US)

( * ) Notice: Subject to any disclaimer, the term of this patent is extended or adjusted under 35 U.S.C. 154(b) by 303 days.

(21) Appl. No.: 11/786,018

(22) Filed: Apr. 9, 2007

(51) Int. Cl.
*H01L 27/082* (2006.01)
(52) U.S. Cl. ........................ 257/137; 257/565
(58) Field of Classification Search ............ None
See application file for complete search history.

(56) References Cited

U.S. PATENT DOCUMENTS

| | | | |
|---|---|---|---|
| 6,249,136 B1 * | 6/2001 | Maley ................ | 324/765 |
| 6,657,242 B1 | 12/2003 | Norstrom et al. ........... | 257/197 |
| 6,677,235 B1 | 1/2004 | Yegnashankaran et al. .. | 438/667 |
| 7,075,133 B1 | 7/2006 | Padmanabhan et al. ..... | 257/276 |
| 7,132,321 B2 | 11/2006 | Kub et al. ................... | 438/172 |
| 7,141,875 B2 | 11/2006 | Hsuan et al. ................. | 257/723 |
| 2006/0131693 A1 * | 6/2006 | Kim .......................... | 257/565 |
| 2007/0145533 A1 * | 6/2007 | Ahlgren et al. ............. | 257/565 |
| 2007/0190692 A1 * | 8/2007 | Erturk et al. ................ | 438/118 |
| 2007/0275533 A1 * | 11/2007 | Vaed et al. .................. | 438/329 |

* cited by examiner

*Primary Examiner*—Kimberly D Nguyen
*Assistant Examiner*—Mohammad Choudhry
(74) *Attorney, Agent, or Firm*—Mark C. Pickering

(57) ABSTRACT

NPN and PNP bipolar junction transistors are formed on a wafer in a fabrication process that eliminates the heavily-doped buried layers and the lightly-doped epitaxial layer by forming back side collector contacts that are electrically connected to an interconnect structure on the top side of the wafer with through-the-wafer contacts.

20 Claims, 15 Drawing Sheets

BIPOLAR TRANSISTOR AND METHOD OF FORMING THE BIPOLAR TRANSISTOR WITH A BACKSIDE CONTACT

BACKGROUND OF THE INVENTION

1. Field of the Invention

The present invention relates to bipolar transistors and, more particularly, to a bipolar transistor and a method of forming the bipolar transistor with a backside contact.

2. Description of the Related Art

A bipolar transistor is a well-known semiconductor device that is commonly used in integrated circuits. Structurally, a bipolar transistor has three regions, which include an emitter region, a base region, and a collector region. The emitter, base, and collector regions have alternating conductivity types with either an npn or a pnp sequence. One common method of fabricating a bipolar transistor is to vertically arrange the alternating conductivity types.

FIGS. 1A-1Q show a series of cross-sectional views that illustrate a prior-art method of fabricating vertically-arranged npn and pnp bipolar transistors. As shown in FIG. 1A, the method, which utilizes a p– semiconductor wafer 110, begins by implanting the top surface of p– semiconductor wafer 110 to form an n+ buried layer 114 in the top surface of p-type semiconductor wafer 110. N+ buried layer 114 can be formed with multiple implant energies to form a thick buried layer.

After n+ buried layer 114 has been formed, as further shown in FIG. 1A, a mask 115 is formed and patterned on the top surface of semiconductor wafer 110. Following this, the exposed regions of the top surface of p– semiconductor wafer 110 are implanted to form a p+ buried layer 116 in the top surface of n+ buried layer 114. As a result, p+ buried layer 116 is separated from p-type semiconductor wafer 110 by n+ buried layer 114. Once p+ buried layer 116 has been formed, mask 115 is removed.

After mask 115 has been removed, as shown in FIG. 1B, an epitaxial layer 120 is grown on the top surface of p-type semiconductor wafer 110. Next, a mask 122 is formed and patterned on the top surface of epitaxial layer 120. Following this, the exposed regions of epitaxial layer 120 are implanted to form a p– region 120P within epitaxial layer 120. Epitaxial layer 120 is formed to have an n-type conductivity and an n– dopant concentration. As a result, the formation of p– region 120P also defines an n– region 120N within epitaxial layer 120. After the implant, mask 122 is removed.

As shown in FIG. 1C, following the removal of mask 122, a number of deep trench isolation regions 124 and shallow trench isolation regions 126 are conventionally formed in epitaxial layer 120. The deep trench isolation regions 124 extend down below buried layer 114 to laterally isolate adjacent n+ buried layers 114.

As shown in FIG. 1D, once the trench isolation regions 124 and 126 have been formed, a mask 130 is formed and patterned on the top surface of epitaxial layer 120. Following this, the exposed regions of epitaxial layer 120 are implanted to form a p– base region 132 within n– region 120N of epitaxial layer 120. Mask 130 is then removed.

Next, a mask (not shown) is formed and patterned on the top surface of epitaxial layer 120. Following this, the exposed regions of epitaxial layer 120 are implanted to form an n– base region 134 within p– region 120P of epitaxial layer 120. Once n– base region 134 has been formed within p– region 120P, the mask is removed.

After this, as shown in FIG. 1E, a mask 136 is formed and patterned on the top surface of epitaxial layer 120. Following this, the exposed regions of epitaxial layer 120 are implanted to form an n+ sinker region 140 within n– region 120N of epitaxial layer 120. Once n+ sinker region 140 has been formed, mask 136 is removed. N+ buried layer 114, n– region 120N, and n+ sinker region 140 function as the collector of the npn transistor.

Next, a mask (not shown) is formed and patterned on the top surface of epitaxial layer 120. Following this, the exposed regions of epitaxial layer 120 are implanted to form a p+ sinker region 142 within p– region 120P of epitaxial layer 120. Once p+ sinker region 142 has been formed within p– region 120P, the mask is removed. P+ buried layer 116, p– region 120P, and p+ sinker region 142 function as the collector of the pnp transistor.

The emitter regions and the base/emitter contact structures can be formed in a number of ways. For example, in a first process, as shown in FIG. 1F, once mask 136 has been removed, a mask 144 is formed and patterned on the top surface of epitaxial layer 120. Following this, the exposed regions of epitaxial layer 120 are implanted to form a p+ base contact region 150 in p– base region 132, and a p+ emitter 152 in n– base region 134. Mask 144 is then removed.

Next, as shown in FIG. 1G, a mask 154 is formed and patterned on the top surface of epitaxial layer 120. After mask 154 has been formed and patterned, the exposed regions of epitaxial layer 120 are implanted to form an n+ emitter region 156 in p– base region 132, and an n+ base contact region 158 in n– base region 134. Mask 154 is removed.

Once mask 154 has been removed, as shown in FIG. 1H, an isolation layer 160 is formed over the top of epitaxial layer 120. After this, a number of contacts 162 are conventionally formed to extend through isolation layer 160 to make electrical connections with n+ sinker region 140, p+ sinker region 142, p+ base contact region 150, p+ emitter region 152, n+ emitter region 156, and n+ base contact region 158.

As shown in FIG. 1I, after the emitter regions and the base/emitter contact structures have been formed, the method next forms an interconnect structure 164 using conventional fabrication processes. Interconnect structure 164 includes an insulation region 164-I that contacts isolation layer 160, a number of metal-1 traces 164-M1 that are connected to the contacts 162, a number of metal-2 traces 164-M2, a number of metal pads 164-P, and a number of metal vias 164-V that connect the metal-1 traces 164-M1 and the metal-2 164-M2 traces together, and the metal-2 traces 164-M2 and the pads 164-P together. (Only two metal layers are shown for purposes of clarity. Additional metal layers can also be used.)

The formation of interconnect structure 164 completes the wafer fabrication sequence, which produces vertically-arranged npn and pnp bipolar transistors. The npn transistor has n+ emitter region 156 that lies over a portion of p– base region 132 which, in turn, lies over n– region 120N and n+ buried layer 114. The pnp transistor has p+ emitter region 152 that lies over a portion of n– base region 134 which, in turn, lies over p– region 120P and p+ buried layer 116.

In a second process of forming the emitter regions and the emitter/base contact structures, as shown in FIG. 1J, once the n+ and p+ sinker regions 140 and 142 have been formed, a layer of first poly (poly1) 166 is deposited on the top surface of epitaxial layer 120. Next, a mask 168 is formed and patterned on the top surface of poly1 layer 166. Following this, the exposed regions of poly1 layer 166 are implanted to form a p+ region 166P in poly layer 166. After p+ region 166P has been formed, mask 168 is removed.

Next, a mask (not shown), which protects p+ region 166P, is formed and patterned on the top surface of poly1 layer 166. Following this, the exposed regions of poly1 layer 166 are implanted to form an n+ region 166N in poly1 layer 166. Once n+ region 166N has been formed in poly1 layer 166, the mask is removed.

After the mask has been removed, as shown in FIG. 1K, a non-conductive layer 170 is formed on the p+ and n+ regions 166P and 166N of poly1 layer 166. A mask 172 is then formed and patterned on non-conductive layer 170. Following this, as shown in FIG. 1L, the exposed regions of non-conductive layer 170 and poly1 layer 166 are etched to form a base contact structure 174 that includes a p+ poly1 region 174P with an overlying non-conductive cap 174C, a base contact structure 176 that includes a p+ poly1 region 176P with an overlying non-conductive cap 176C, a base contact structure 178 that includes an n+ poly1 region 178P with an overlying non-conductive cap 178C, and a base contact structure 180 that includes an n+ poly1 region 180P with an overlying non-conductive cap 180C. Mask 172 is then removed.

Once mask 172 has been removed, as shown in FIG. 1M, an isolation layer is deposited and then anisotropically etched back to form isolation spacers 182. Once isolation spacers 182 have been formed, a layer of second poly (poly2) 184 is deposited on non-conductive caps 174C, 176C, 178C, and 180C and isolation spacers 182. Next, a mask 186 is formed and patterned on the top surface of poly2 layer 184. Following this, the exposed regions of poly2 layer 184 are implanted to form an n+ region 184N in poly2 layer 184. After n+ region 184N has been formed, mask 186 is removed.

Next, a mask (not shown), which protects n+ region 184N, is formed and patterned on the top surface of poly2 layer 184. Following this, the exposed regions of poly2 layer 184 are implanted to form a p+ region 184P in poly2 layer 184. Once p+ region 184P has been formed in poly2 layer 184, the mask is removed.

As shown in FIG. 1N, after n+ and p+ regions 184N and 184P have been formed in poly2 layer 184, a mask 190 is formed and patterned on the top surface of poly2 layer 184. Following this, as shown in FIG. 1O, the exposed regions of poly2 layer 184 are etched to form an n+ emitter contact structure 192 and a p+ emitter contact structure 194. Mask 190 is then removed.

Semiconductor wafer 110 is then annealed which, in turn, causes dopants from the p+ poly1 regions 174P and 176P, n+ emitter contact structure 192, the n+ poly1 regions 178P and 180P, and p+ emitter contact structure 194 to outdiffuse. The outdiffusion from the p+ poly1 regions 174P and 176P forms p+ base contact regions 174A and 176A, respectively, in p− base region 132. The outdiffusion from n+ emitter contact structure 192 forms n+ emitter region 192A in p− base region 132. The outdiffusion from n+ poly1 regions 178P and 180P forms n+ base contact regions 178A and 180A in n− base region 134. The outdiffusion from p+ emitter contact structure 194 forms p+ emitter region 194A in n− base region 134.

After this, as shown in FIG. 1P, an isolation layer 196 is formed over the top of epitaxial layer 120. After this, a number of contacts 198 are conventionally formed to extend through isolation layer 196 to make electrical connections with n+ emitter contact structure 192, n+ sinker region 140, p+ emitter contact structure 194, and p+ sinker region 142; through both isolation layer 196 and isolation caps 174C and 176C to contact the p+ poly1 regions 174P and 176P; and through both isolation layer 196 and isolation caps 178C and 180C to contact the n+ poly1 regions 178P and 180P.

As shown in FIG. 1Q, the method next forms interconnect structure 164 shown in FIG. 1I using conventional fabrication processes. Interconnect structure 164 includes insulation region 164-I that contacts isolation layer 196, metal-1 traces 164-M1 that are connected to the contacts 198, metal-2 traces 164-M2, metal pads 164-P, and metal vias 164-V that connect the metal-1 traces 164-M1 and the metal-2 164-M2 traces together, and the metal-2 traces 164-M2 and the pads 164-P together.

The formation of interconnect structure 164 completes the wafer fabrication sequence, which produces vertically-arranged npn and pnp bipolar transistors. The npn transistor has n+ emitter region 192A that lies over a portion of p− base region 132 which, in turn, lies over n− region 120N and n+ buried layer 114. The pnp transistor has p+ emitter region 194A that lies over a portion of n− base region 134 which, in turn, lies over p− region 120P and p+ buried layer 116.

Although the above method forms vertically-arranged npn and pnp bipolar transistors, there is a need for alternate methods of forming bipolar transistors.

DETAILED DESCRIPTION OF THE INVENTION

Figure 2A:
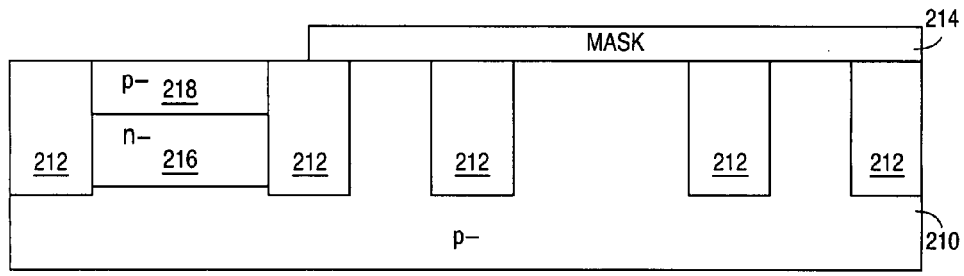
FIGS. 2A-2N are a series of cross-sectional views illustrating an example of a method of fabricating a vertically-arranged npn bipolar transistor and a vertically-arranged pnp bipolar transistor in accordance with the present invention.
Figure 2B:
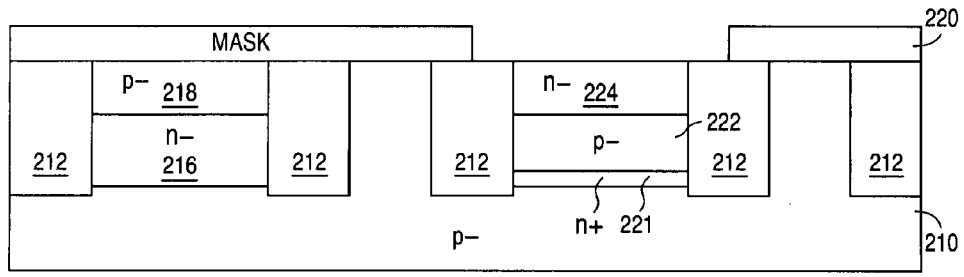
Figure 2C:
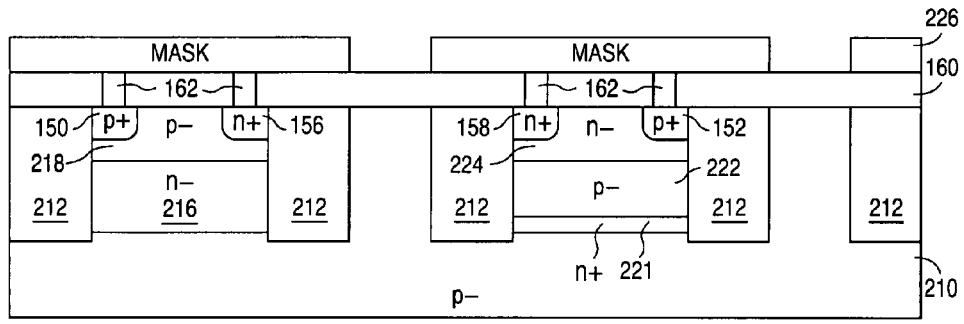
Figure 2D:
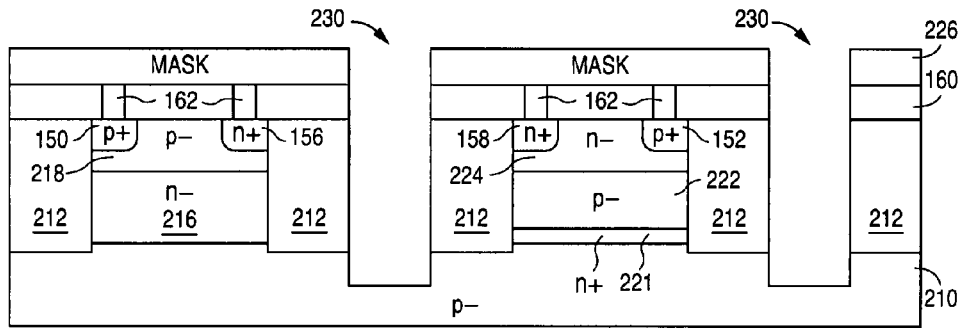
Figure 2E:
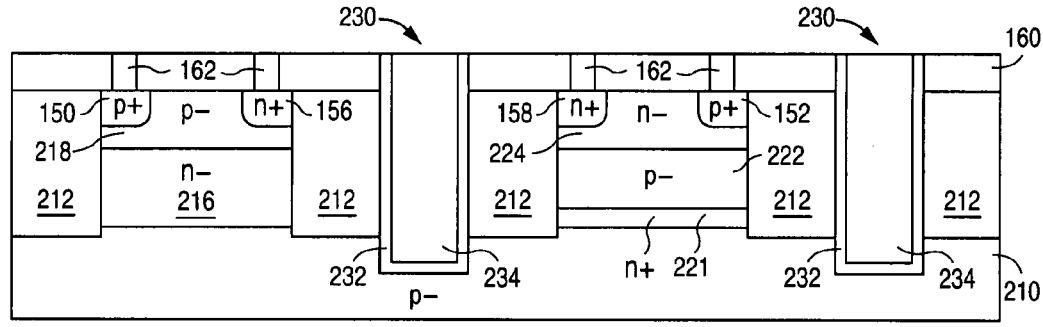
Figure 2F:
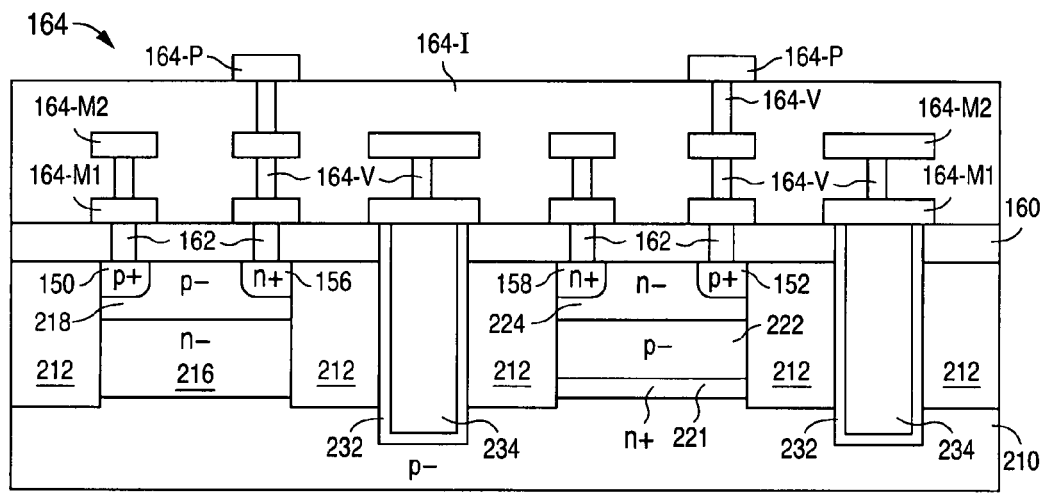
Figure 2G:
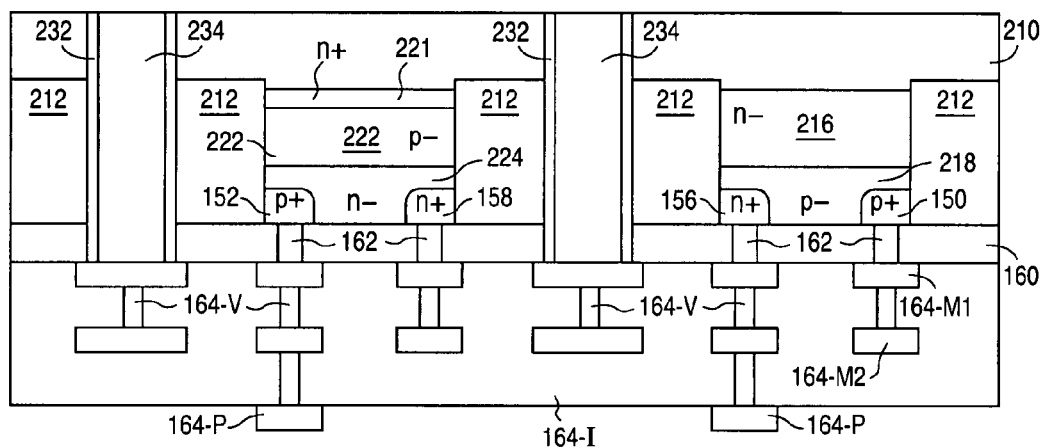
Figure 2H:
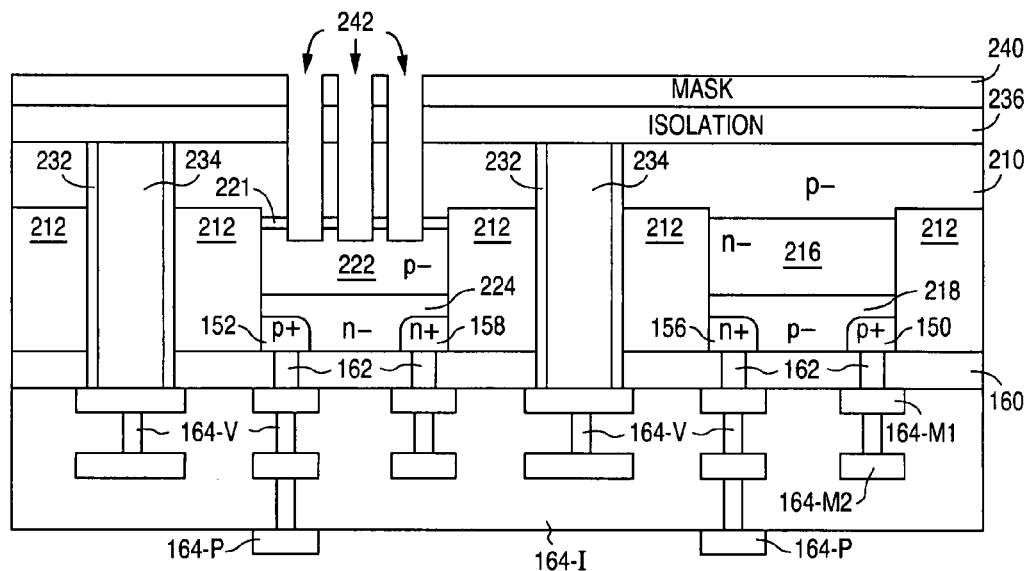
Figure 2I:
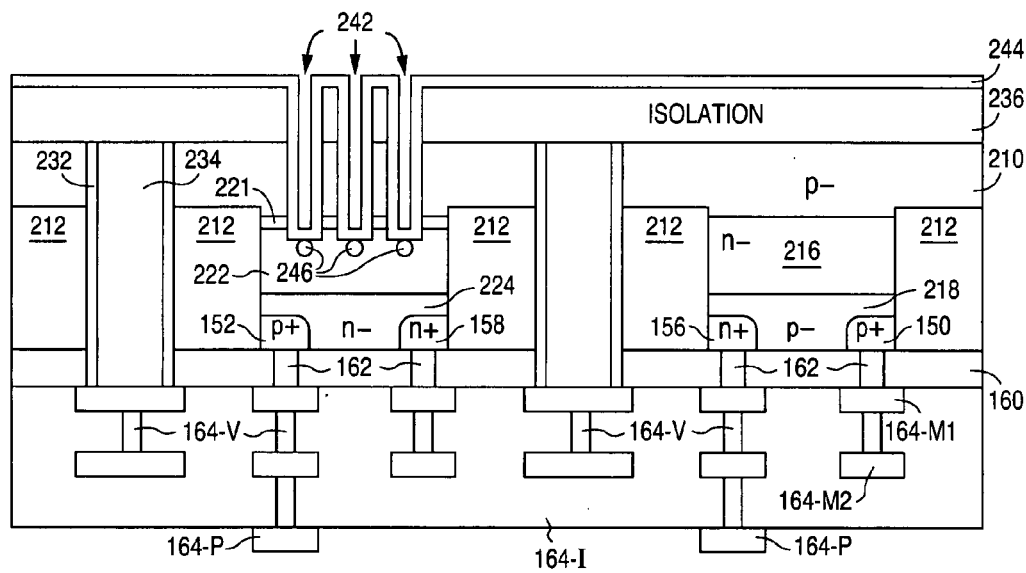
Figure 2J:
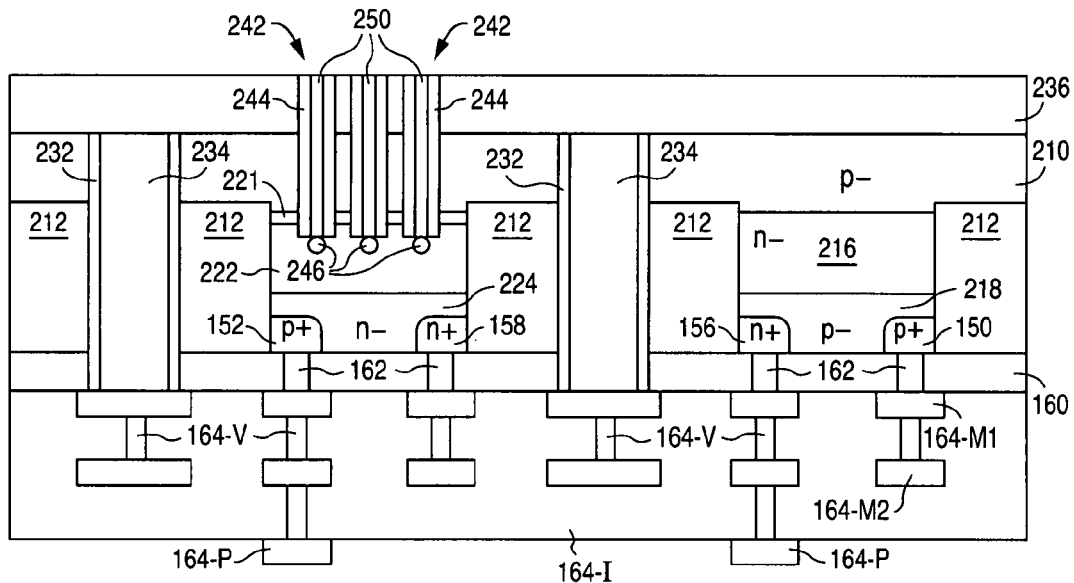
Figure 2K:
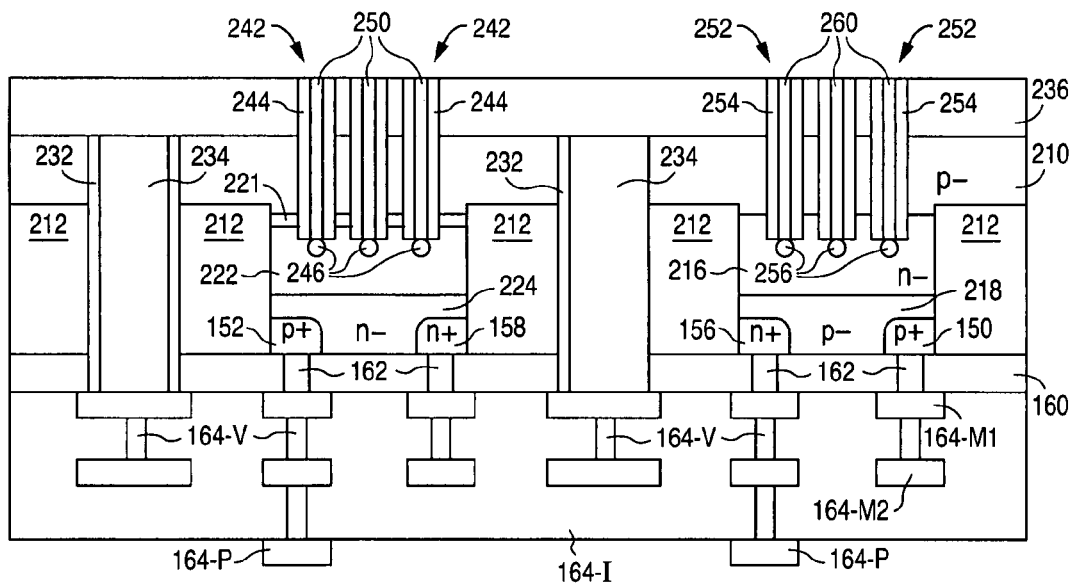
Figure 2L:
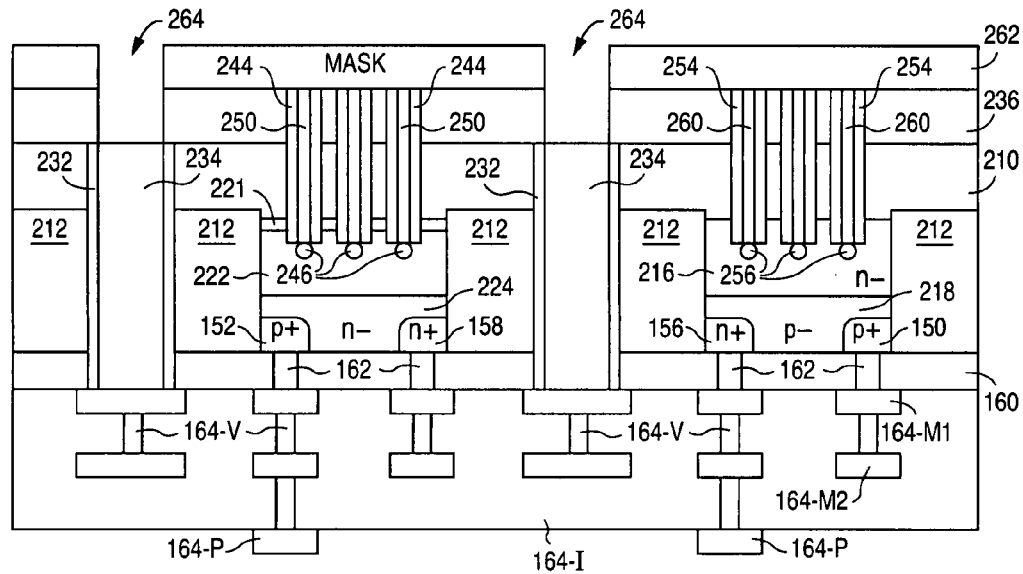
Figure 2M:
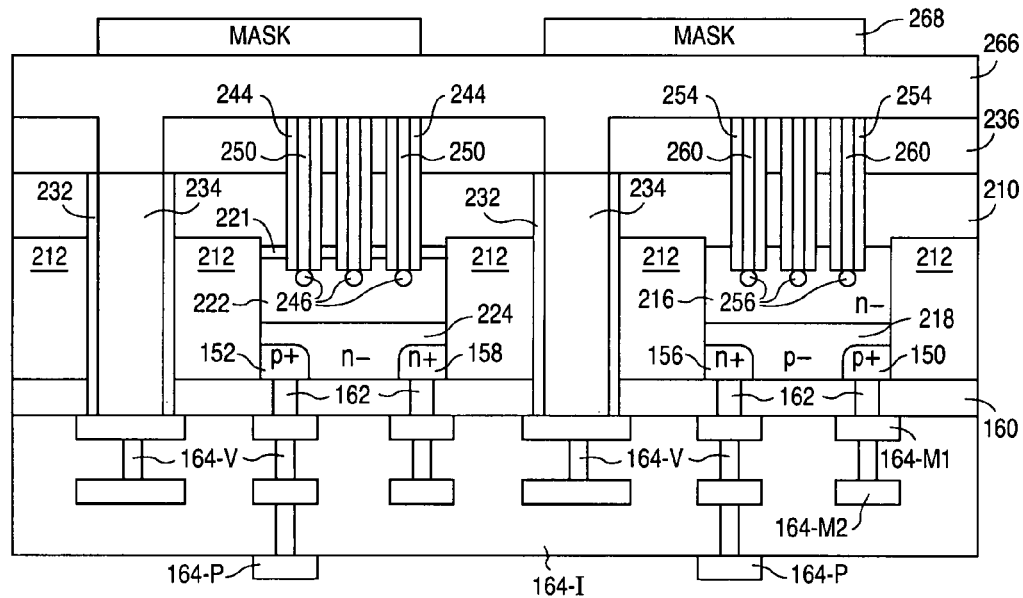
Figure 2N:
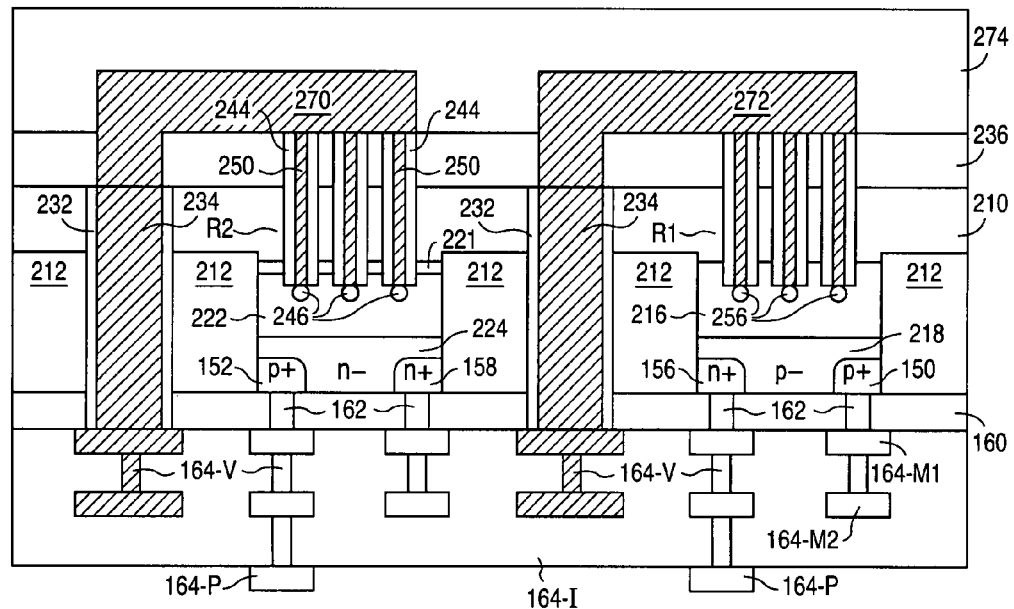

FIGS. 2A-2N show a series of cross-sectional views that illustrate an example of a method of fabricating a vertically-arranged npn bipolar transistor and a vertically-arranged pnp bipolar transistor in accordance with the present invention. As described in greater detail below, the present invention utilizes back side collector contacts and through-the-wafer contacts to form vertically-arranged npn and pnp bipolar transistors.

As shown in FIG. 2A, the method utilizes a conventionally-formed p-type semiconductor wafer 210 that includes a number of deep trench isolation regions 212. As further shown in FIG. 2A, the method begins by forming and patterning a mask 214 on the top surface of p− semiconductor wafer 210 to expose a region of the top surface of p− semiconductor wafer 210.

After mask 214 has been patterned, the exposed region of p− semiconductor wafer 210 is implanted to form an n− collector region 216 of a to-be-formed npn bipolar transistor. Following this, the exposed region of p− semiconductor wafer 210 is again implanted to form a p− base region 218 of the to-be-formed npn bipolar transistor. Mask 214 is then removed.

Once mask 214 has been removed, as shown in FIG. 2B, a mask 220 is formed and patterned on the top surface of p− semiconductor wafer 210 to expose a region of the top surface of p− semiconductor wafer 210. After mask 220 has been patterned, the exposed region of p− semiconductor wafer 210 is implanted to form an n+ region 221. Next, the exposed region of p− semiconductor wafer 210 is again implanted to form a p− collector region 222 of a to-be-formed pnp bipolar transistor.

Following this, the exposed region of p− semiconductor wafer 210 is further implanted to form an n− base region 224 of the to-be-formed pnp bipolar transistor. Mask 220 is then removed. (The p-type implant that forms p− collector region 222 can be omitted if the dopant concentration of semiconductor wafer 210 is equal to the desired dopant concentration of the pnp collector region.)

Figure 1A:
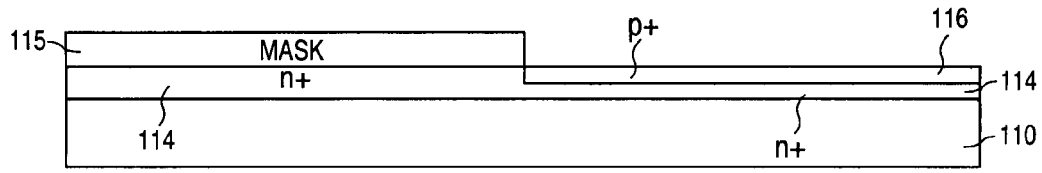
FIGS. 1A-1Q are a series of cross-sectional views illustrating a prior-art method of fabricating vertically-arranged npn and pnp bipolar transistors.
Figure 1B:
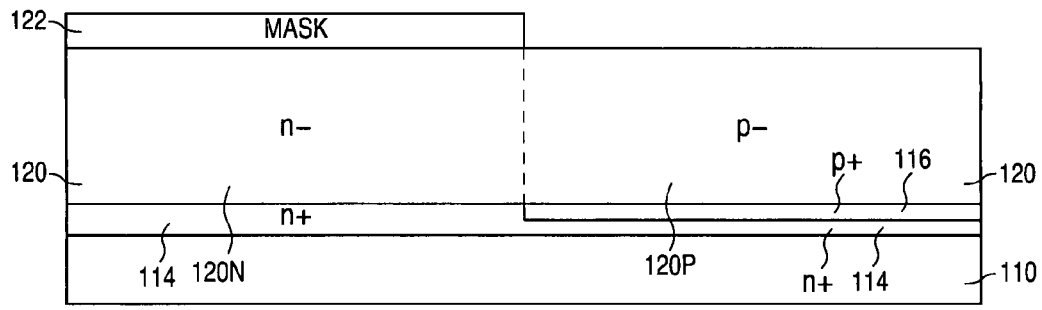
Figure 1C:
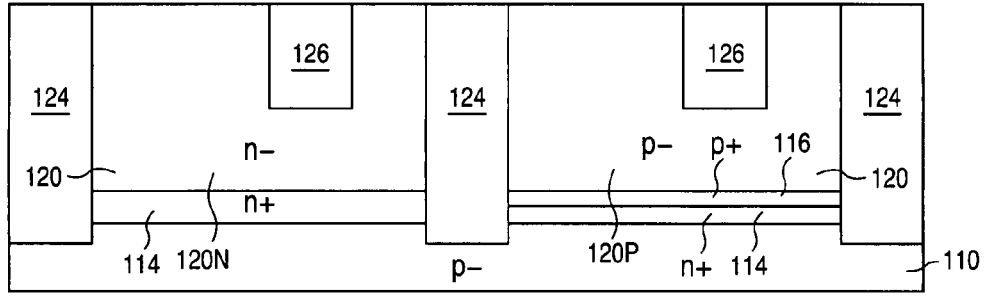
Figure 1D:
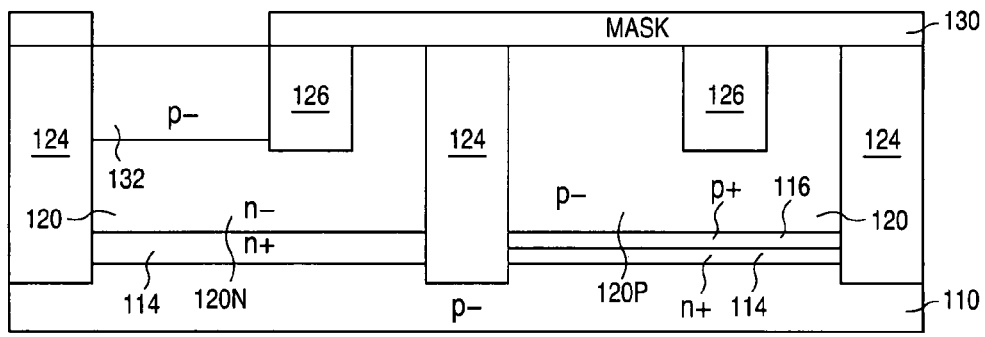
Figure 1E:
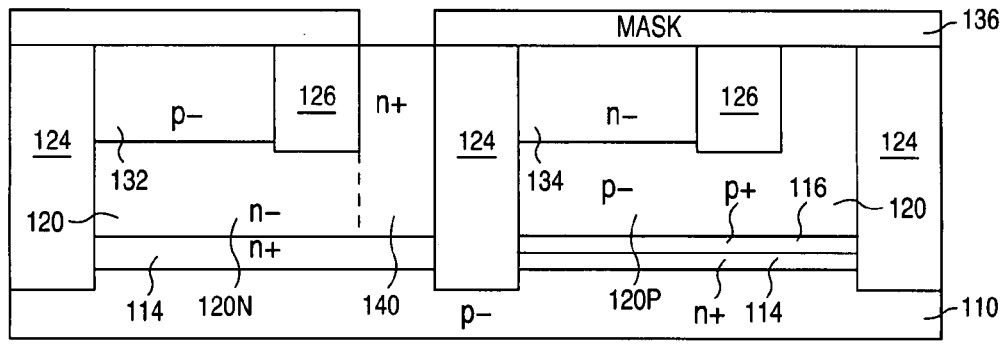
Figure 1F:
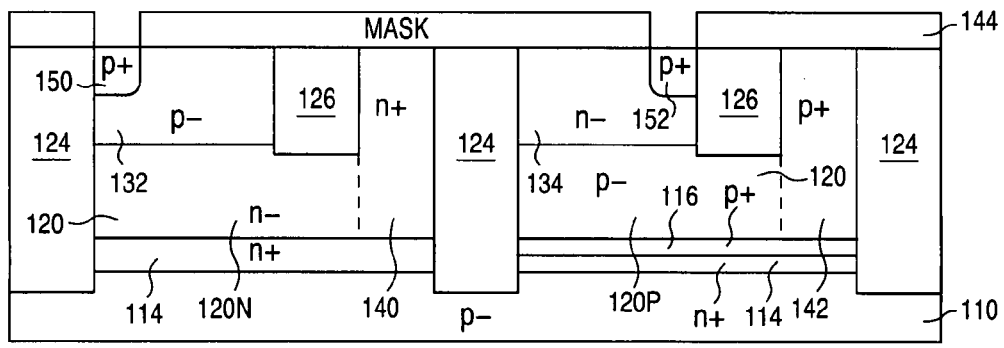
Figure 1G:
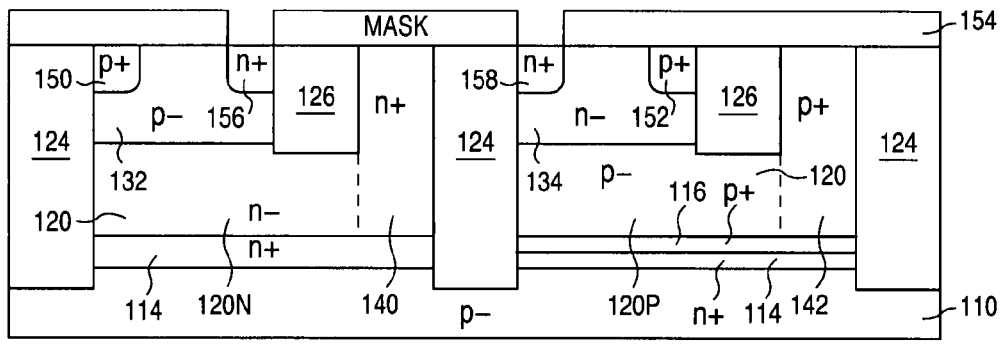
Figure 1H:
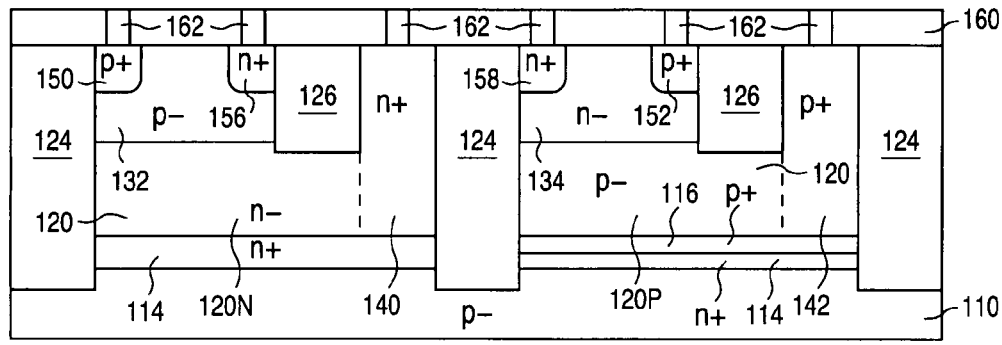

The emitter regions and the emitter/base contact structures are next formed in a conventional manner. For example, as shown in FIG. 2C, after following the first process (with respect to the emitter regions and the emitter/base contact structures) as described above and shown in FIGS. 1F-1H, wafer 210 includes a p+ base contact region 150 in p− base region 218, an n+ emitter region 156 in p− base region 218, an n+ base contact region 158 in n− base region 224, and a p+ emitter region 152 in n− base region 224. In addition, wafer 210 includes an isolation layer 160 and a number of contacts 162 that extend through isolation layer 160 to make electrical connections with p+ base contact region 150, n+ emitter region 156, n+ base contact region 158, and p+ emitter region 152.

In accordance with the present invention, as shown in FIG. 2C, n− collector region 216 is spaced apart from every contiguous region of n-type conductivity that touches the top surface of semiconductor wafer 210, while p− collector region 222 is spaced apart from every contiguous region of p-type conductivity that touches the top surface of semiconductor wafer 210.

As shown in FIG. 2D, after the conventional formation of contacts 162, the method of the present invention continues by forming and patterning a mask 226 on the top surface of isolation layer 160. Following this, the exposed regions of isolation layer 160 and underlying semiconductor wafer 210 are etched to form a number of deep openings 230. Mask 226 is then removed.

Next, as shown in FIG. 2E, a layer of non-conductive material 232 is formed to line the bottom and side wall surfaces of the deep openings 230. Once non-conductive layer 232 has been formed, a layer of conductive contact material is deposited on the top surface of isolation layer 160 to fill up the deep openings 230. The layer of contact material is then planarized to form a number of deep contacts 234.

Figure 1I:
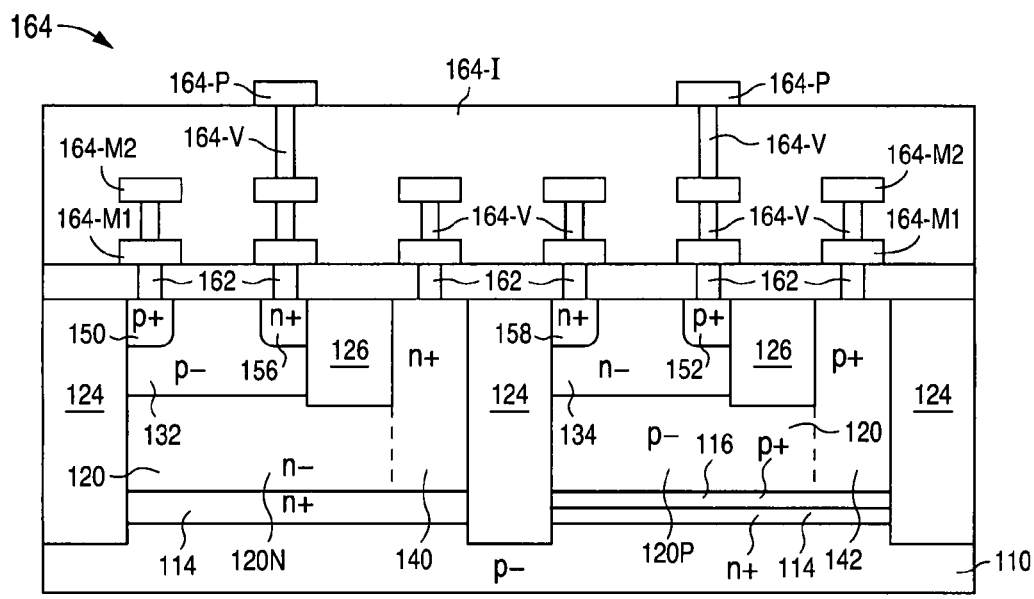
Figure 1J:
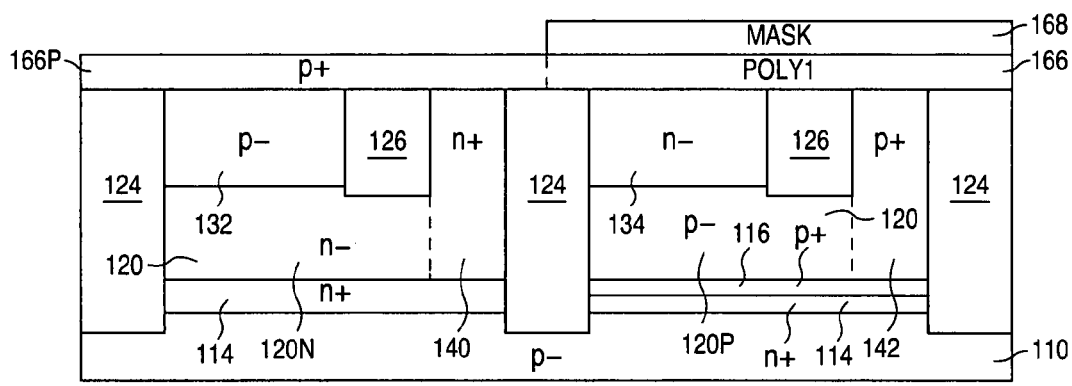
Figure 1K:
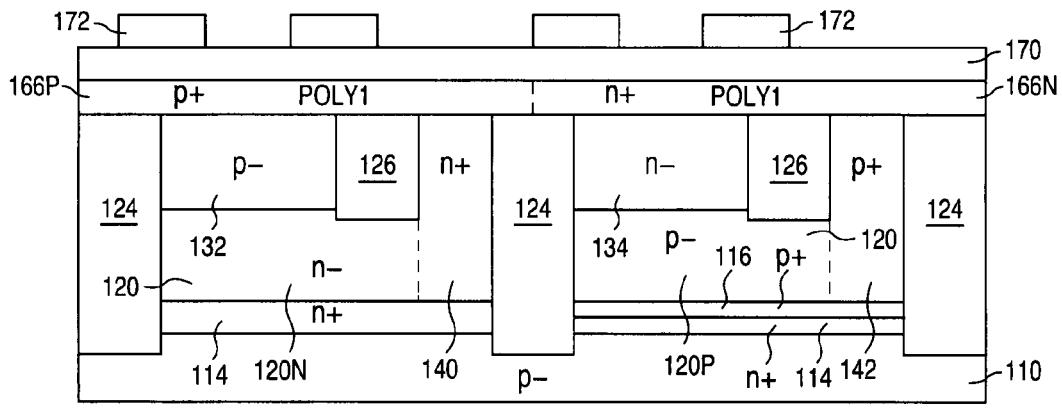
Figure 1L:
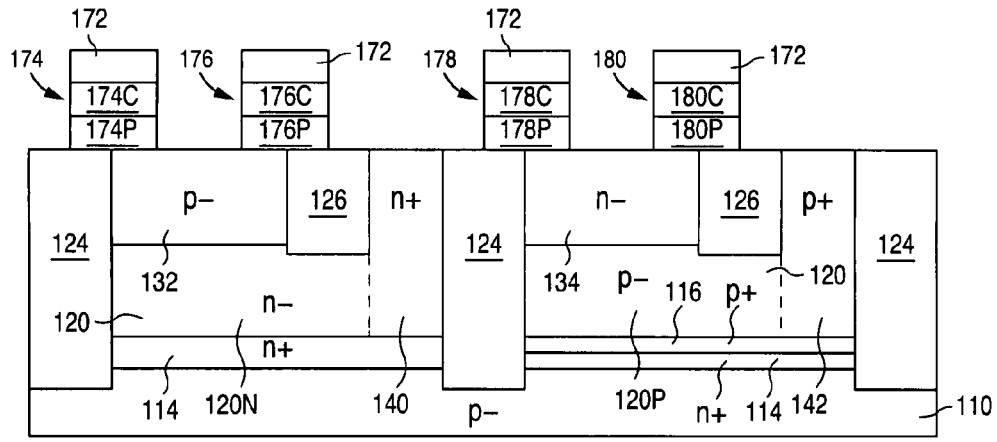
Figure 1M:
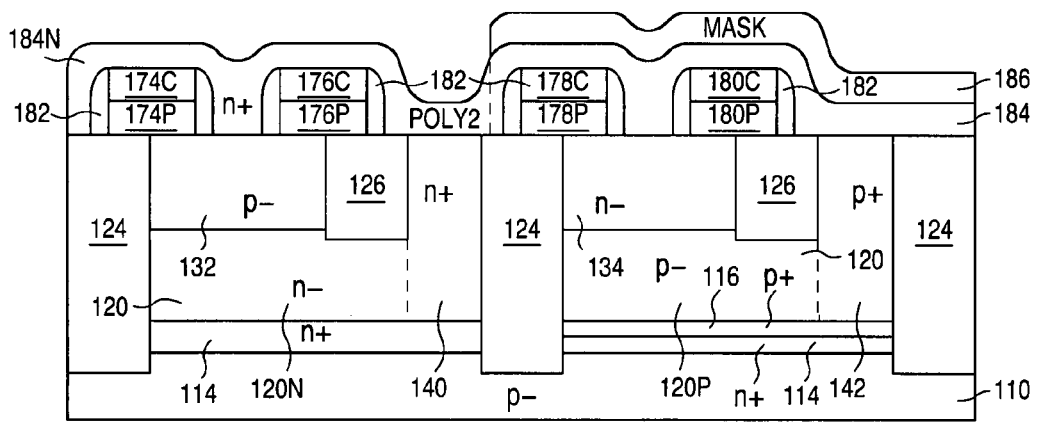
Figure 1N:
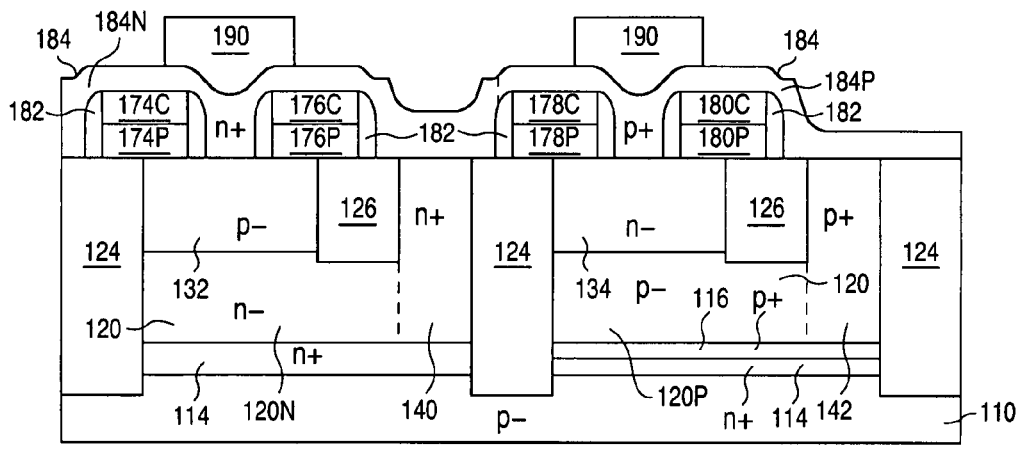
Figure 1O:
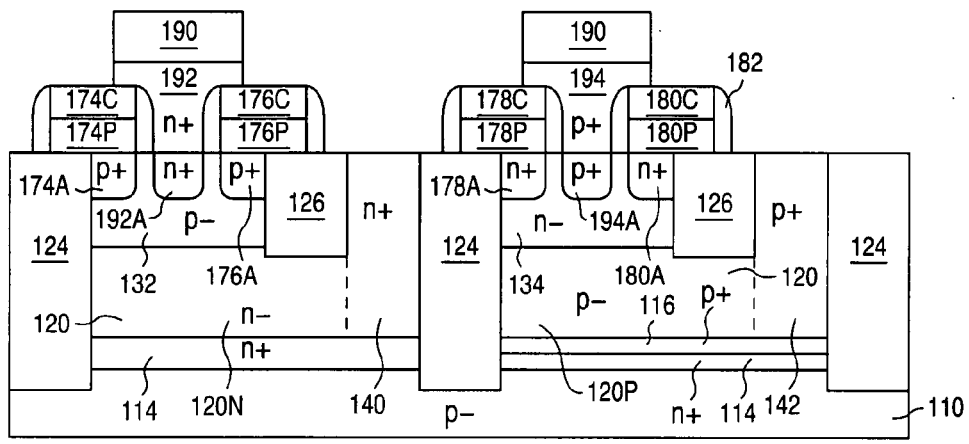
Figure 1P:
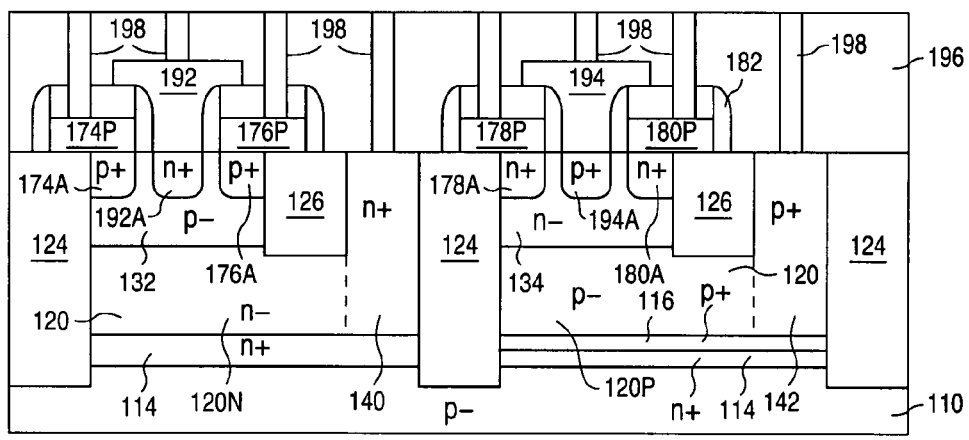
Figure 1Q:
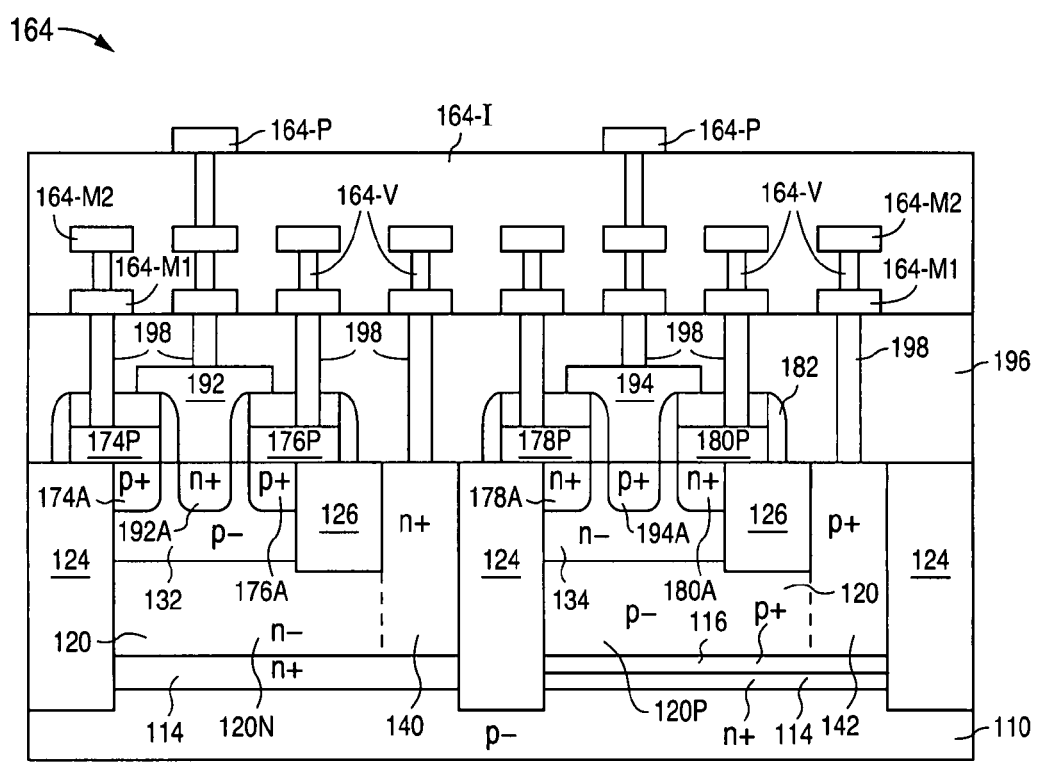

As shown in FIG. 2F, the method next forms interconnect structure 164 shown in FIG. 1I using conventional fabrication processes. Interconnect structure 164 includes insulation region 164-I that contacts isolation layer 160, metal-1 traces 164-M1 that are electrically connected to the contacts 162 and 234, metal-2 traces 164-M2, pads 164-P, and vias 164-V that connect the metal-1 traces 164-M1 and the metal-2 164-M2 traces together, and the metal-2 traces 164-M2 and the pads 164-P together.

As shown in FIG. 2G, after the conventional formation of interconnect structure 164, the bottom surface of semiconductor wafer 210 is planarized until the deep contacts 234 are exposed. (The following figures show wafer 210 flipped over so that the processes performed to the bottom surface are shown performed to the top of the figure.)

After the planarization, as shown in FIG. 2H, an isolation layer 236 is formed on the bottom surface of semiconductor wafer 210 to touch the deep contacts 234. Next, a mask 240 is formed and patterned on isolation layer 236. Following this, the exposed regions of isolation layer 236, semiconductor wafer 210, n+ region 221, and p− collector region 222 are etched to form a number of collector openings 242. Mask 240 is then removed.

Once mask 240 has been removed, as shown in FIG. 2I, a non-conductive layer 244 is formed on isolation layer 236 to line the side wall and bottom surfaces of the collector openings 242. After this, the bottom surfaces of the collector openings 242 are implanted to form p+ collector contact regions 246 in p− collector region 222.

As shown in FIG. 2J, following the formation of the p+ collector contact regions 246, non-conductive layer 244 is anisotropically etched to remove non-conductive layer 244 from isolation layer 236 and the bottom surfaces of the collector openings 242. Next, a layer of conductive contact material is deposited on isolation layer 236 to fill up the collector openings 242. The layer of contact material, which touches the p+ collector contact regions 246, is then planarized to form back side collector contacts 250.

After this, a mask (not shown) is formed and patterned on isolation layer 236. Following this, as shown in FIG. 2K, the exposed regions of isolation layer 236, semiconductor wafer 210, and n− collector region 216 are etched to form a number of collector openings 252. The mask is then removed. Once the mask has been removed, a non-conductive layer 254 is formed on isolation layer 236 to line the side wall and bottom surfaces of the collector openings 252.

After non-conductive layer 254 has been formed, the bottom surfaces of the collector openings 252 are implanted to form n+ collector contact regions 256 in n− collector region 216. Following the formation of n+ collector contact regions 256, non-conductive layer 254 is anisotropically etched to remove non-conductive layer 254 from isolation layer 236 and the bottom surfaces of the collector openings 252.

Next, a layer of conductive contact material is deposited on isolation layer 236 to fill up the collector openings 252. The layer of contact material, which touches the n+ collector contact regions 256, is then planarized to form back side collector contacts 260 as shown in FIG. 2K. Once back side contacts 260 have been formed, as shown in FIG. 2L, a mask 262 is formed and patterned on isolation layer 236. Following this, the exposed regions of isolation layer 236 are etched to form openings 264 that expose the deep contacts 234. Mask 262 is then removed. After mask 262 has been removed, as shown in FIG. 2M, a layer of conductive material 266 is deposited on isolation layer 236 to fill up openings 264. Once material 266 has been deposited, a mask 268 is formed and patterned on conductive material layer 266.

Following this, as shown in FIG. 2N, the exposed regions of conductive contact layer 266 are etched to form a back side pnp collector line 270 that makes electrical connections to a deep contact 234 and the back side collector contacts 250, and a back side npn collector line 272 that makes electrical connections to a deep contact 234 and the back side collector contacts 260. Mask 268 is then removed.

Thus, as shown by the hatched lines in FIG. 2N, a conductive (e.g., metallic) line extends from the backside contacts 250 to collector line 270 to deep contact 234 to metal-1 trace 164-M1, via 164-V, and metal-2 trace 164-M2. Similarly, a conductive (e.g., metallic) line extends from the backside contacts 260 to collector line 272 to deep contact 234 to metal-1 trace 164-M1, via 164-V, and metal-2 trace 164-M2. After the removal of mask 268, a layer of protective material 274 is formed on isolation layer 236 and the collector lines 270 and 272.

Thus, a method of forming vertically-arranged npn and pnp bipolar transistors has been described. One of the advantages of the present invention is that the present invention eliminates the need to form a buried layer and an epitaxial layer. As further shown in FIG. 2N, the region R1 of semiconductor wafer 210 that lies between n− collector region 216 and the bottom surface of semiconductor wafer 210, and touches n− collector region 216 and the bottom surface of semiconductor wafer 210 has a substantially uniform dopant concentration, being free of an n+ buried layer. Similarly, the region R2 of semiconductor wafer 210 that lies between p− collector region 222 and the bottom surface of semiconductor wafer 210, and touches p− collector region 222 and the bottom surface of semiconductor wafer 210 has a substantially uniform dopant concentration, being free of a p+ buried layer.

An additional advantage of the present invention is that by utilizing backside and through-the-wafer contacts instead of the conventional heavily-doped sinker region, the present invention also substantially reduces the collector resistance, and increases the operating speed of the npn and pnp bipolar transistors.

Figure 3:
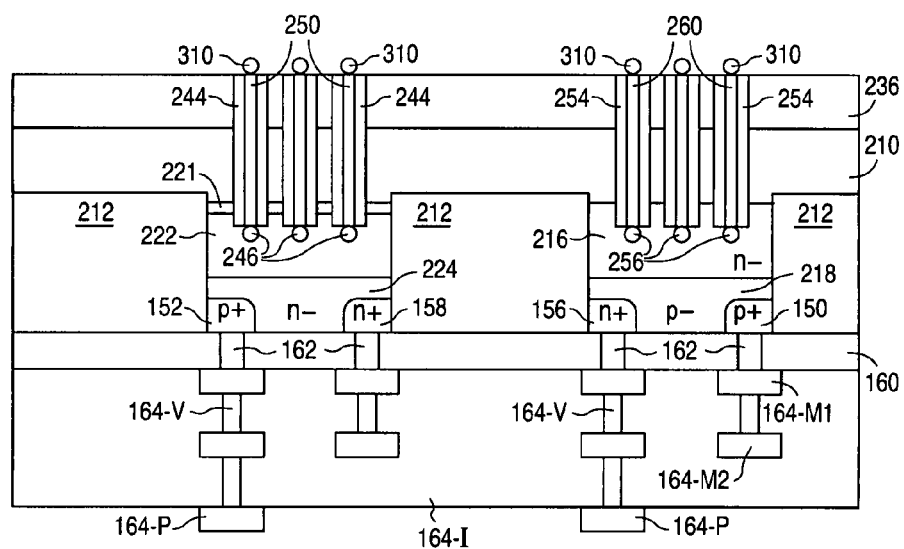
FIG. 3 shows a cross-sectional view of an example of a vertically-arranged npn bipolar transistor and a vertically-arranged pnp bipolar transistor in accordance with an alternate embodiment of the present invention.

FIG. 3 shows a cross-sectional view of an example of a vertically-arranged npn bipolar transistor and a vertically-arranged pnp bipolar transistor in accordance with an alternate embodiment of the present invention. The bipolar transistor structures shown in FIG. 3 are similar to the bipolar transistor structures shown in FIGS. 2A-2N and, as a result, utilize the same reference numerals to designate the structures which are common to both.

As shown, the vertically-arranged npn bipolar transistor and the vertically-arranged pnp bipolar transistor of FIG. 3 lack the through-the-die deep contacts 234. As a result, the vertically-arranged transistors are more compact than the vertically-arranged transistors of FIG. 2. The vertically-arranged npn bipolar transistor and the vertically-arranged pnp bipolar transistor of FIG. 3 are formed in the same manner as in FIGS. 2A-2C and 2E-2K, except that one of the deep trench isolation regions 212 between each laterally adjacent transistor has been eliminated. In addition, the processes associated with FIGS. 2D and 2E relating to the formation of the through-the-die deep contacts 234, and the processes associated FIGS. 2L-2N relating to the formation of the backside traces have been eliminated. As shown in FIG. 3, after the structure in FIG. 2K has been formed, solder balls 310 are connected to the back side collector contacts 250 and 260.

FIGS. 4A-4E show a series of cross-sectional views that illustrate another example of a method of fabricating a vertically-arranged npn bipolar transistor and a vertically-arranged pnp bipolar transistor in accordance with the present invention. The bipolar transistor structures shown in FIGS. 4A-4E are similar to the bipolar transistor structures shown in FIGS. 1A-1Q and FIGS. 2A-2N and, as a result, utilize the same reference numerals to designate the structures which are common to both. As noted above, in the present invention, the emitter regions and the emitter/base contact structures of the transistors are formed in a conventional manner. FIGS. 4A-4E illustrate the present invention with another emitter/base contact structure.

Figure 4A:
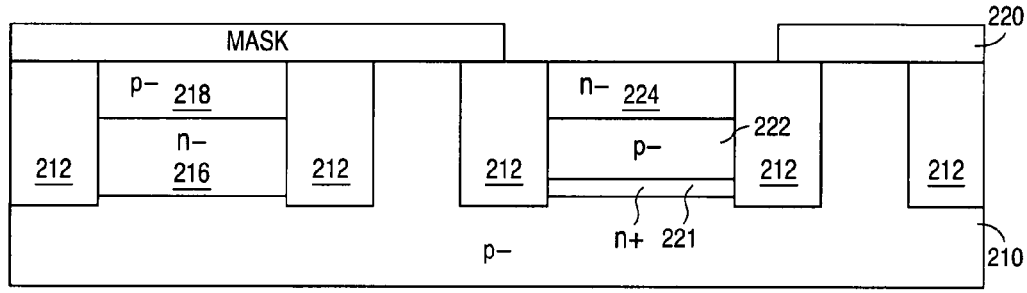
FIGS. 4A-4E are a series of cross-sectional views illustrating an example of a method of fabricating a vertically-arranged npn bipolar transistor and a vertically-arranged pnp bipolar transistor in accordance with the present invention.
Figure 4B:
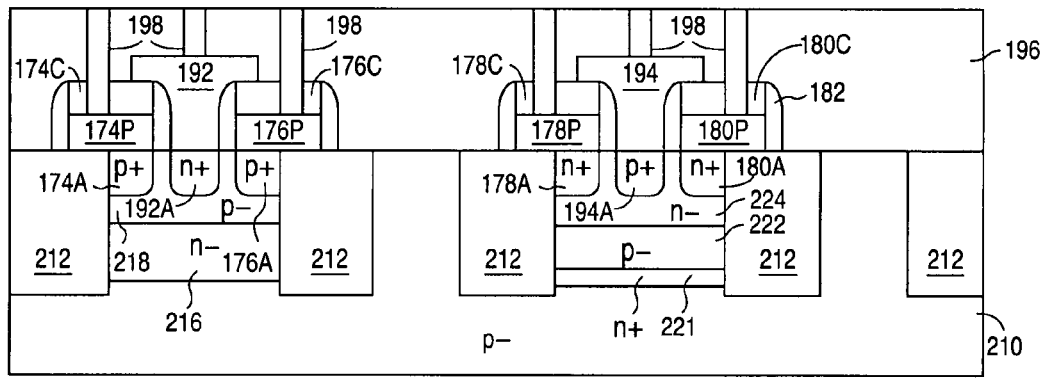

The method of the present invention follows the processes discussed above and described with respect to FIGS. 2A-2B to form the structure shown in FIG. 4A. Following this, the method follows the second process (with respect to the emitter regions and the emitter/base contact structures) discussed above and described with respect to FIGS. 1J-1P to form the structure shown in FIG. 4B. As a result, wafer 210 includes p+ poly1 region 174P, non-conductive cap 174C, p+ poly1 region 176P, non-conductive cap 176C, n+ poly1 region 178P, non-conductive cap 178C, n+ poly1 region 180P, non-conductive cap 180C, isolation spacers 182, n+ emitter contact structure 192, and p+ emitter contact structure 194. Wafer 210 includes isolation region 196 and contacts 198.

Further, as above, n− collector region 216 is spaced apart from every contiguous region of n-type conductivity that touches the top surface of semiconductor wafer 210, while p− collector region 222 is spaced apart from every contiguous region of p-type conductivity that touches the top surface of semiconductor wafer 210.

Figure 4C:
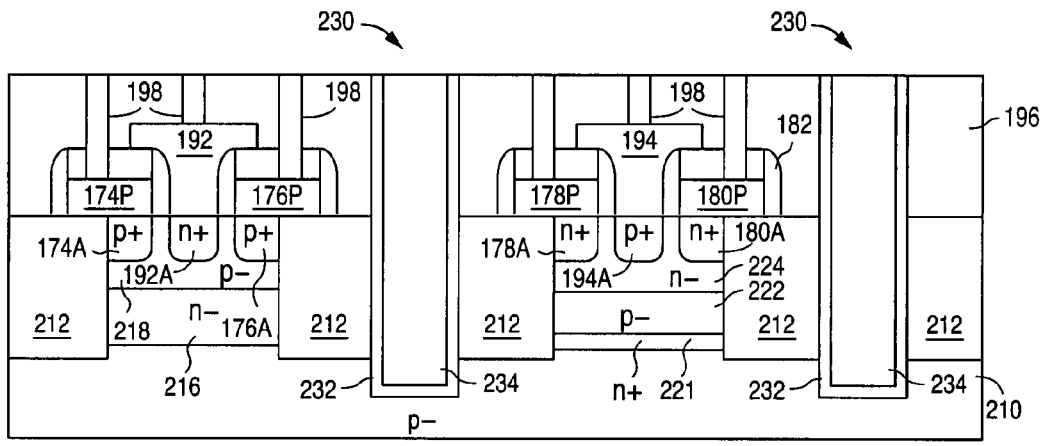
Figure 4D:
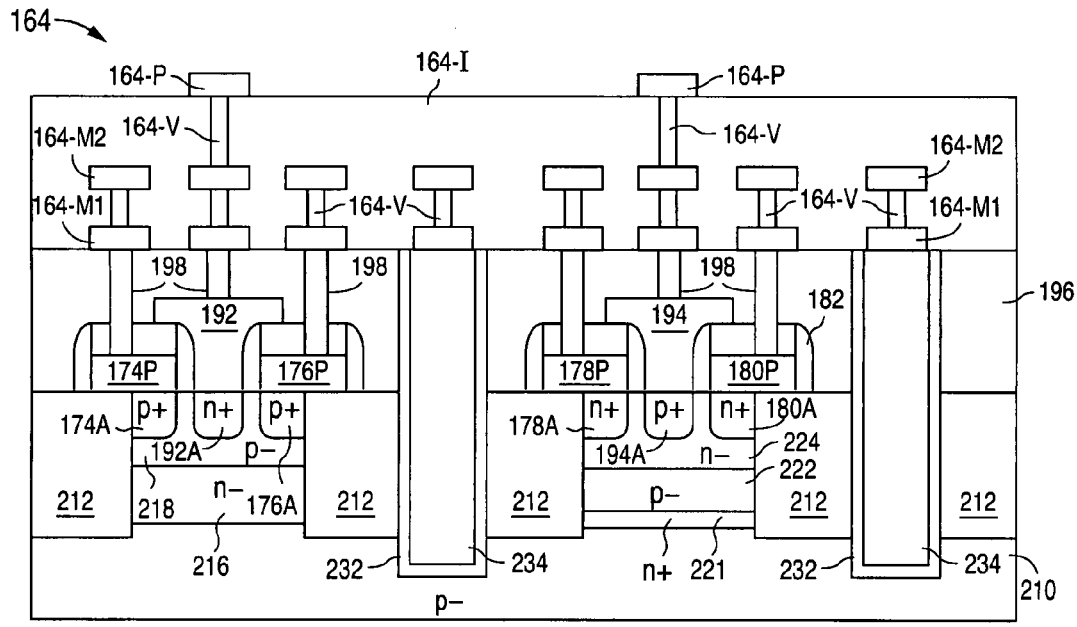
Figure 4E:
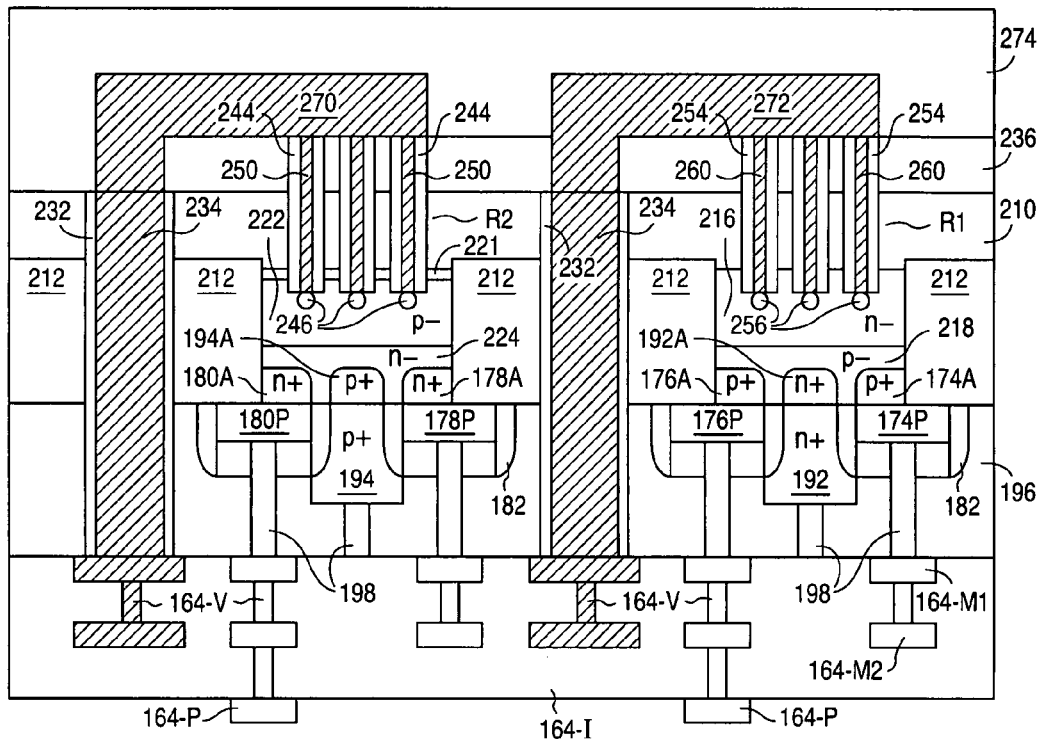

After forming the emitter regions and the emitter/base contact structures as shown in FIGS. 1J-1P, the method of the present invention follows the processes discussed above and described with respect to FIGS. 2D-2E to form the structure shown in FIG. 4C. After this, the method follows the processes discussed above and described with respect to FIG. 1Q to form the structure shown in FIG. 4D. Next, the method follows the processes discussed above and described with respect to FIGS. 2G-2N to form the structure shown in FIG. 4E. Thus, a method of forming vertically-arranged npn and pnp bipolar transistors which are free of an n+ buried layer in region R1, an n+ sinker region, a p+ buried layer in region R2, a p+ sinker region, and an epitaxial layer has been described.

Figure 5:
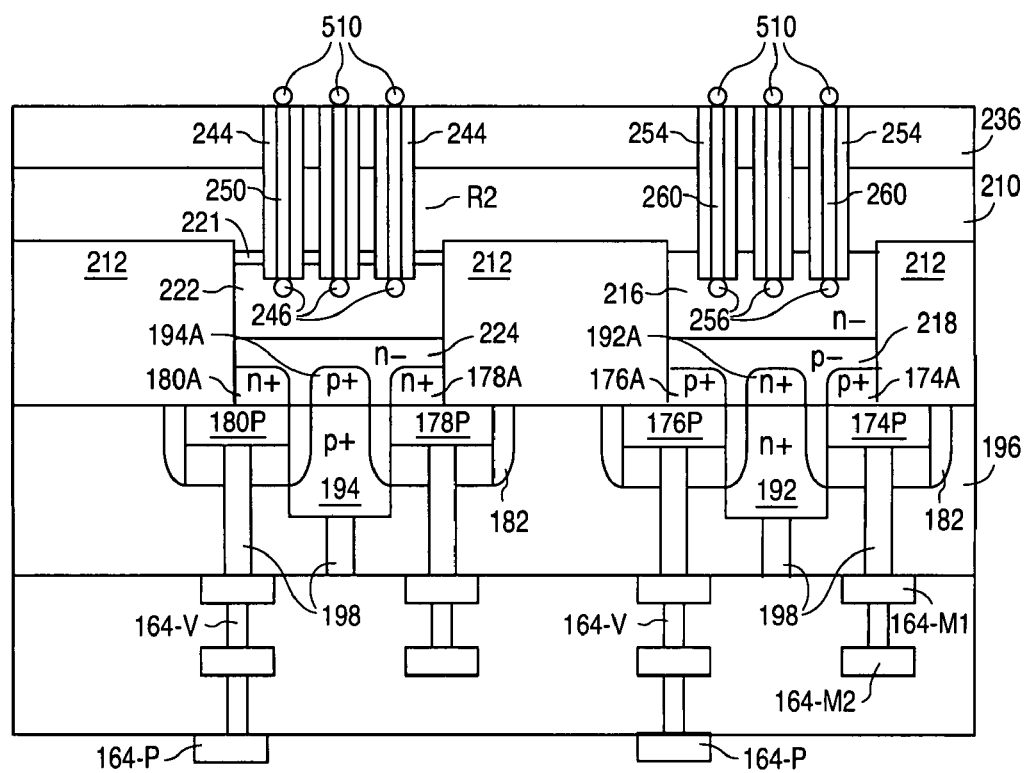
FIG. 5 shows a cross-sectional view of an example of a vertically-arranged npn bipolar transistor and a vertically-arranged pnp bipolar transistor in accordance with an alternate embodiment of the present invention.

FIG. 5 shows a cross-sectional view of an example of a vertically-arranged npn bipolar transistor and a vertically-arranged pnp bipolar transistor in accordance with an alternate embodiment of the present invention. The bipolar transistor structures shown in FIG. 5 are similar to the bipolar transistor structures shown in FIGS. 4A-4E and, as a result, utilize the same reference numerals to designate the structures which are common to both.

As shown, the vertically-arranged npn bipolar transistor and the vertically-arranged pnp bipolar transistor of FIG. 5 also lack the through-the-die deep contacts 234. As a result, the vertically-arranged transistors are more compact than the vertically-arranged transistors of FIGS. 4A-4E. The vertically-arranged npn bipolar transistor and the vertically-arranged pnp bipolar transistor of FIG. 5 are formed in the same manner as in FIGS. 4A, 4B, 4D, and 2G-2K, except that one of the deep trench isolation regions 212 between each laterally adjacent transistor has been eliminated. In addition, the processes associated with FIG. 4C (FIGS. 2D and 2E) relating to the formation of the through-the-die deep contacts 234, and the processes associated FIGS. 2L-2N relating to the formation of the backside traces have been eliminated. As shown in FIG. 5, after the structure in FIG. 2K has been formed, solder balls 510 are connected to the back side collector contacts 250 and 260.

It should be understood that the above descriptions are examples of the present invention, and that various alternatives of the invention described herein may be employed in practicing the invention. For example, in the present discussion, n+ region 221 floats. However, contacts similar to the back side collector contacts 250 (with non-conductive layer 244) can be formed through isolation layer 236 and semiconductor wafer 210 to make an electrical connection to n+ region 221 to set a bias voltage on n+ region 221, via solder balls or the through-the-die conductive structures. Thus, it is intended that the following claims define the scope of the invention and that structures and methods within the scope of these claims and their equivalents be covered thereby.

What is claimed is:

1. A bipolar transistor comprising:
   a semiconductor material of a first conductivity type, the semiconductor material having a top surface and a bottom surface;
   an emitter region of a second conductivity type located in the semiconductor material, the emitter region touching the top surface of the semiconductor material;

a base region of the first conductivity type located in the semiconductor material, the base region touching the emitter region and the top surface of the semiconductor material;

a collector region of the second conductivity type located in the semiconductor material, the collector region lying below the base region and the emitter region, having a bottom surface, being spaced apart from the emitter region and the top surface of the semiconductor material, and touching the base region, all of the bottom surface of the collector region being vertically spaced apart from the bottom surface of the semiconductor material;

a collector contact region of the second conductivity type located in the semiconductor material, the collector contact region touching the collector region, having a dopant concentration that is greater than a dopant concentration of the collector region, and lying directly vertically below and spaced apart from the base region; and a metallic structure that lies entirely directly vertically below the collector region, the metallic structure being electrically connected to the collector contact region.

2. The bipolar transistor of claim 1 and further comprising an isolation structure that touches the metallic structure and the semiconductor material, the isolation structure electrically isolating the metallic structure from the semiconductor material.

3. The bipolar transistor of claim 2 wherein all of the bottom surface of the semiconductor material that lies directly vertically below the collector region lies in a single substantially horizontal plane.

4. The bipolar transistor of claim 2 wherein the metallic structure touches the collector contact region.

5. The bipolar transistor of claim 2 and further comprising:

a metallic member, a first portion of the metallic member lying in a first plane that coincides with the top surface of the semiconductor material, a second portion of the metallic member lying in a second plane that coincides with the bottom surface of the semiconductor material; and a non-conductive structure that touches the metallic member and the semiconductor material, the non-conductive structure electrically isolating the metallic member from the semiconductor material.

6. The bipolar transistor of claim 5 and further comprising a metallic line that touches the isolation structure, the metallic structure, and the metallic member, the metallic line extending through the isolation structure to touch the metallic member.

7. The bipolar transistor of claim 6 wherein all of the bottom surface of the semiconductor material that lies directly vertically below the collector region lies in a single substantially horizontal plane.

8. The bipolar transistor of claim 7 wherein the non-conductive structure touches the collector region, and electrically isolates the metallic member from the collector region.

9. The bipolar transistor of claim 8 wherein the non-conductive structure touches the emitter region, and electrically isolates the metallic member from the emitter region.

10. The bipolar transistor of claim 8 and further comprising a metal interconnect structure that touches the metallic member, the metal interconnect structure lying above the top surface of the semiconductor material.

11. A bipolar transistor comprising:

an emitter region of a first conductivity type;

a base region of a second conductivity type, the base region touching the emitter region;

a collector region of the first conductivity type, the collector region having a bottom surface and a top surface, the top surface touching and lying below the base region;

a collector contact region of the first conductivity type, the collector contact region touching the collector region, being entirely spaced apart from the bottom surface and the top surface of the collector region, lying entirely below the base region, and having a dopant concentration that is greater than a dopant concentration of the collector region; and a metallic structure that lies entirely directly vertically below the collector region, the metallic structure touching the collector contact region.

12. The bipolar transistor of claim 11 wherein a top surface of the metallic structure lies above a lowest portion of the collector region, and a bottom surface of the metallic structure lies below the lowest portion of the collector region.

13. The bipolar transistor of claim 12 and further comprising an isolation region that touches the collector region and the metallic structure, and lies horizontally between the collector region and the metallic structure.

14. The bipolar transistor of claim 13 wherein a top surface of the isolation region and the top surface of the metallic structure lie substantially in a common horizontal plane.

15. The bipolar transistor of claim 13 wherein a widest portion of the metallic structure is substantially less than a widest portion of the collector region.

16. The bipolar transistor of claim 13 and further comprising a semiconductor region having the second conductivity type, the semiconductor region touching and lying below the collector region, and being spaced apart from the metallic structure, a lowest portion of the semiconductor region lying below the lowest portion of the collector region.

17. The bipolar transistor of claim 16 and further comprising an isolation layer that touches the semiconductor region and lies entirely below the semiconductor region, the isolation layer being spaced apart from the collector region.

18. The bipolar transistor of claim 17 wherein a bottom surface of the metallic structure and a bottom surface of the isolation layer lie substantially in a common horizontal plane.

19. The bipolar transistor of claim 17 and further comprising a metallic line that touches the isolation layer and the metallic structure, the metallic line extending in a horizontal direction.

20. The bipolar transistor of claim 19 and further comprising:

a metallic member touching the isolation layer and the metallic line, being spaced apart from the metallic structure, and extending in a vertical direction; and a non-conductive structure touching the base region and the collector region and lying horizontally between the metallic member and the base region.

* * * * *